United States Patent [15] 3,707,685
Geffe [45] Dec. 26, 1972

[54] Q-INVARIANT ACTIVE FILTERS

[72] Inventor: Philip R. Geffe, Laurel, Md.
[73] Assignee: Westinghouse Electric Corporation, Pittsburgh, Pa.

[22] Filed: May 21, 1970
[21] Appl. No.: 39,277

[52] U.S. Cl. ......................330/21, 330/31, 330/107, 330/109
[51] Int. Cl. ..............................................H03f 3/04
[58] Field of Search..................330/21, 31, 107, 109

[56] References Cited

UNITED STATES PATENTS 3,296,546 1/1967 Schneider, Jr.........................330/21

OTHER PUBLICATIONS

"Active Filters" Wireless World pp 76–80 February 1970
"Active Filters" Electronic Design pp. 114–121 une 21, 1969

*Primary Examiner*—Roy Lake
*Assistant Examiner*—Lawrence J. Dahl
*Attorney*—F. H. Henson and E. P. Klipfel

[57] ABSTRACT

Three-amplifier Q-invariant active filters having three forms; low pass, band pass and high pass. In each form, the element values are preselected to provide zero sensitivity of the pole Q to the frequency-determining passive elements.

8 Claims, 4 Drawing Figures

Q-INVARIANT ACTIVE FILTERS

CROSS-REFERENCES TO RELATED APPLICATIONS

Q-invariant active filters may be attained with circuitry as described and claimed in my copending application Ser. No. 828,170, entitled "Q-invariant Active Resonator" and my copending application Ser. No. 39,276, filed May 21, 1970 and entitled "Q-invariant Active Filter;" both applications being assigned to the present assignee.

BACKGROUND OF THE INVENTION

1. Field of the Invention

The present invention relates generally to active filters and more particularly relates to three-amplifier RC filters which are Q-invariant.

2. Description of the Prior Art

Most RC active filters utilizing one, two or three amplifiers have the inherent disadvantage that the Q is sensitive to small drifts in the passive elements. In order to be useful, an active filter must be an exception to this rule.

I have found that by utilizing three amplifiers in the given circuit, I overcome the difficulty and provide the following advantages:

1. The circuit is useful in filter design.
2. The above mentioned Q sensitivity is not merely low, but is in fact, zero.

Accordingly, an object of the present invention is to provide useful filtering action.

Another object of the present invention is to provide exceptional Q stability, especially in respect to the thermal coefficients of Q.

SUMMARY OF THE INVENTION

Briefly, the present invention provides an active filter with outstanding thermal stability by providing three amplifier means, the first of which is an inverting amplifier selected to have a very high gain, the second and the third, being selected to be functionally related to the expression $(4Q^2 - 1)$ for a normalized center frequency at unity to attain a low pass or a high pass filter and selected to be functionally related to the expression $[1 - (1/4Q^2)]$ for a normalized center frequency at unity to provide a band pass filter. In other words the first amplifier $A_1$ is inverting. Then the second and third amplifiers $A_2$ and $A_3$ are either both inverting or both non-inverting.

DESCRIPTION OF THE DRAWINGS

Further objects and advantages of the present invention will be readily apparent from the following detailed description taken in conjunction with the drawings in which.

DESCRIPTION OF THE PREFERRED EMBODIMENTS

Figure 1:
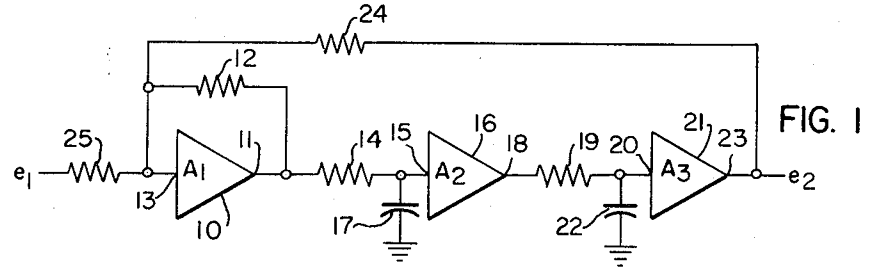
FIG. 1 is an electrical schematic diagram of an illustrative embodiment of the present invention exhibiting low pass characteristics.

Referring to FIG. 1, an inverting amplifier 10 of very high gain has its output 11 fed back through an impedance shown as a resistor 12 to its input 13. The output $e_o$ at 11 is also fed through resistor 14 to the input 15 of a unity gain amplifier 16. A capacitor 17 connects the input 15 of the amplifier 16 to a point of reference potential. Output 18 of the amplifier 16 is connected through a resistor 19 to the input 20 of an amplifier 21. A capacitor 22 connects the input 20 to a point of reference potential. The output $e_2$ at 23 is fed back through an impedance shown as a resistance element 24 to the input 13 of the amplifier 10. A resistor 25 connects the input signal $e_1$ to the input means 13.

A couple of ratios are helpful in simplifying the transfer function of the filter illustrated in FIG. 1. That is, the ratio of the magnitude of the feedback resistor element 12 to the input resistor 25, or $R_0/R_4$, will be identified as a constant, *a*. The ratio of the magnitude of the feedback resistor element 12 to the feedback resistor element 24, or $R_0/R_3$, will be identified as a constant, *b*. The time constant of the first resistor 14 and first capacitor 17, or $R_1 C_1$, is identified as $T_1$. The time constant of the second resistor 19 and second capacitor 22, or $R_2 C_2$ is identified at $T_2$.

The amplifiers 10, 16 and 21 are selected to have high input impedances and low output impedances. Ordinary operational amplifiers may readily be utilized. The gain $A_1$ of the amplifier 10 is chosen to be sufficiently high that the transfer function results in the low pass form:

$$\frac{e_2}{e_1}=\frac{\left(\frac{aA}{T_1T_2}\right)}{S^2+\left(\frac{T_1+T_2}{T_1T_2}\right)S+\left(\frac{1-Ab}{T_1T_2}\right)} \quad (1)$$

where the frequency operator $j\omega$ is identified as:

$$\left.\begin{aligned} S&=j\omega \\ \text{and}\quad A&=A_2\cdot A_3 \\ a&=R_0/R_4 \\ b&=R_0/R_3 \\ T_1&=R_1\,C_1 \\ T_2&=R_2\,C_2 \end{aligned}\right\} \quad (2)$$

From equation (1), the center frequency $\omega O$ and pole $Q$ can be determined to be $$\omega O=\sqrt{(1-Ab)/T_1\,T_2} \quad (3)$$

$$Q=\frac{\sqrt{T_1T_2(1-Ab)}}{T_1+T_2} \quad (4)$$

and the sensitivity of the pole $Q$ with respect to the first time constant $T_1$ and the second time constant $T_2$ are derived to be $$S_{T_1}{}^{Q} = \tfrac{1}{2} - (T_1/T_1 + T_2) \qquad (5)$$

$$S_{T_2}{}^{Q} = \tfrac{1}{2} - (T_2/T_1 + T_2) \qquad (6)$$

Normalizing the center frequency $\omega_0$ at unity then determines the time constants $T_1$ and $T_2$ as well as the necessary gain $A$ of the amplifiers 16 and 21. That is, $$T_1 = T_2 = 2Q \qquad (7)$$

$$-Ab = 4Q^2 - 1 \qquad (8)$$

When the ratio $b$ and the gain $A$ of the amplifiers 16 and 21 are selected to provide a negative gain of $(4Q^2 - 1)$, the passive $Q$ sensitivities as stated in Equations (5) and (6) will result in $$S_{T_1}{}^{Q} = S_{T_2}{}^{Q} = 0 \qquad (9)$$

It is necessary that the gain $A_1$ of the amplifier 10 be chosen to be very large for all forms of the filter; that is, low pass, band pass and high pass $A_1$ sums $e_1$ and $e_2$. The accuracy of summation increases continuously with increasing gain.

Figure 2:
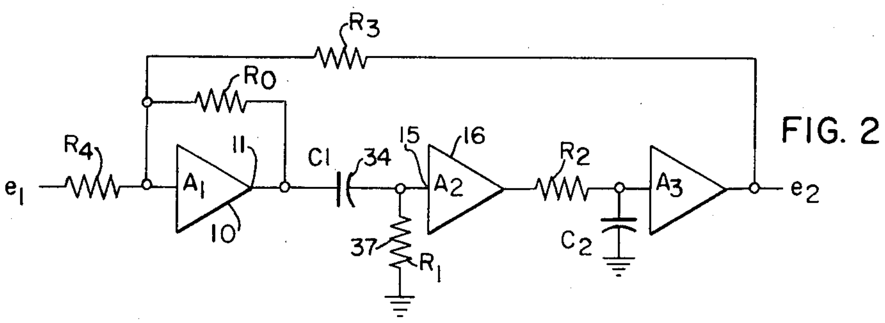
FIGS. 2 and 3 are electrical schematic diagrams of illustrative embodiments of the present invention which exhibit band pass characteristics.

FIG. 2 illustrates a band pass resonator wherein elements similar to those utilized in FIG. 1 have been assigned identical reference characters. A first capacitor 34 however connects the output 11 of the amplifier 10 to the input 15 of amplifier 16. A resistor 37 connects the input 15 to a point of reference potential.

The transfer function in band pass form then may be shown as $$\frac{e_2}{e_1} = \frac{\left(\frac{aA}{T_2}\right) S}{S^2 + \left(\frac{T_1 + T_2 - AbT_1}{T_1 T_2}\right) S + \frac{1}{T_1 T_2}} \qquad (10)$$

The center frequency $\omega_0$ and the pole $Q$ are then determined $$\omega O = 1/\sqrt{T_1 T_2} \qquad (11)$$

$$Q = \sqrt{T_1 T_2}/[(1 - Ab) T_1 + T_2] \qquad (12)$$

and the differential sensitivities of pole $Q$ with respect to the first time constant $T_1$ and the second time constant $T_2$ can be derived $$S_{T_1}{}^{Q} = \tfrac{1}{2} - (1 - Ab) T_1/[(1-Ab) T_1 + T_2] \qquad (13)$$

$$S_{T_2}{}^{Q} = \tfrac{1}{2} - T_2/[(1-Ab) T_1 + T_2] \qquad (14)$$

Normalizing the center frequency then simplifies the time constants and desired gain to be $$T_1 = 2Q \qquad (15)$$

$$T_2 = 1/2Q \qquad (16)$$

$$Ab = 1 - (1/4Q^2) \qquad (17)$$

which give $$S_{T_1}{}^{Q} = S_{T_2}{}^{Q} = 0 \qquad (18)$$

Figure 3:
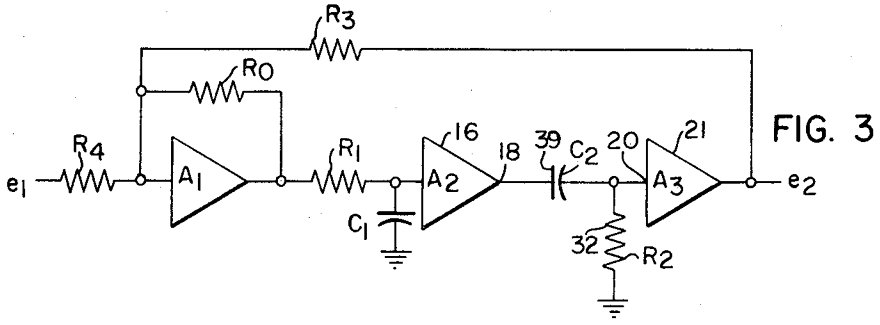

FIG. 3 illustrates an alternate embodiment of the Q-invariant active filter having the band pass form. Once again similar elements to those utilized in FIG. 1 have been assigned like reference characters. However, now a capacitor 39 connects the output 18 of amplifier 16 to the input 20 of amplifier 21. A resistor 32 connects the input 20 to a point of reference potential. Similar results are then obtained to that shown in equation (18) with the normalized values of Equations (15), (16) and (17). That is, similar results are obtained by interchanging the second resistor and second capacitor as was obtained in FIG. 2 by interchanging the first capacitor and first resistor.

Figure 4:
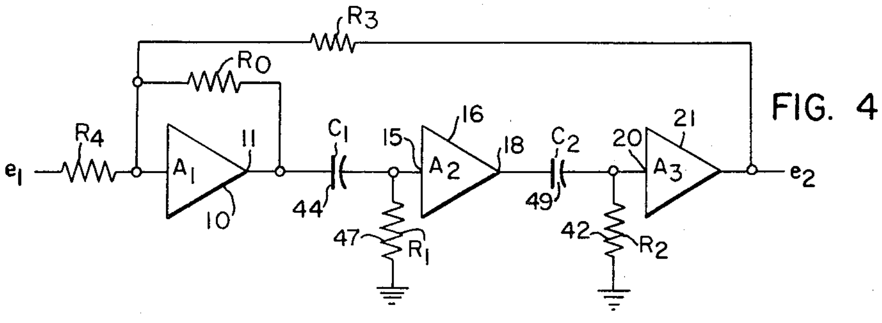
FIG. 4 is an electrical schematic diagram of an illustrative embodiment of the present invention illustrating high pass characteristics.

The circuitry of FIG. 4 illustrates a high pass form of Q-invariant active filter by interchanging the first resistor and first capacitor as well as the second resistor and second capacitor. Once again identical reference characters have been assigned to elements similar to those utilized in FIG. 1. However, a capacitor 44 connects the output 11 of amplifier 10 to the input 15 of amplifier 16. A resistor 47 connects the input 15 to a point of reference potential.

A capacitor 49 connects the output 18 of amplifier 16 to the input 20 of the amplifier 21. A resistor 42 connects the input 20 to a point of reference potential.

With such an embodiment the transfer function will be $$\frac{e_2}{e_1} = \frac{\left(\frac{aA}{1 - Ab}\right) S^2}{S^2 + \left[\frac{T_1 T_2}{(1 - Ab) T_1 T_2}\right] S + \frac{1}{(1 - Ab) T_1 T_2}} \qquad (19)$$

which results in the pole center frequency $\omega_0$ and the pole $Q$ being $$\omega_0 = 1/\sqrt{(1 - Ab) T_1 T_2} \qquad (20)$$

$$Q = \sqrt{(1 - Ab) T_1 T_2}/(T_1 + T_2) \qquad (21)$$

The differential sensitivities are then determined to be $$S_{T_1}{}^{Q} = \tfrac{1}{2} - (T_1/T_1 + T_2) \qquad (22)$$

$$S_{T_2}{}^{Q} = \tfrac{1}{2} - (T_2/T_1 + T_2) \qquad (23)$$

For a normalized center frequency the time delays and the gain of the amplifier 21 are determined to be $$T_1 = T_2 = 1/2Q \qquad (24)$$

$$-Ab = 4Q^2 - 1 \qquad (25)$$

The resultant differential sensitivities will then be $$S_{T_1}{}^{Q} = S_{T_2}{}^{Q} = 0 \qquad (26)$$

While the present invention has been described with a degree of particularity for the purposes of illustration, it is to be understood that all modifications, substitutions and alterations within the spirit and scope of the present invention are herein meant to be included.

I claim as my invention:

1. A Q-invariant active filter comprising, in combination: first, second, and third amplifier means each including input means and output means; an input impedance connecting an input signal to the input means of said first amplifier means; a first resistance feedback element connecting the output means of said first amplifier means to the input means of said first amplifier means; first resistive means connecting the output means of said first amplifier means to the input means of said second amplifier means; first capacitive means connecting the input means of said second amplifier means to a point of reference potential; second resistive means connecting the output means of said second amplifier means to the input means of said third amplifier means; second capacitive means connecting the input means of said third amplifier means to a point of reference potential; a second resistance feedback element connecting the output means of said third amplifier means to the input means of said first amplifier means; and wherein the product of the gain of said second and third amplifier means and the ratio of the first resistance feedback element to the second resistance feedback element is substantially equal to $(4Q^2-\alpha 1)$ for a normalized center frequency at unity.

2. The combination of claim 1 wherein the time constant as determined by the product of said first resistive means and said first capacitive means and the time constant as determined by the product of said second resistive means and said second capacitive means are both substantially equal to $2Q$ for a normalized center frequency at unity.

3. A band-pass Q-invariant active filter comprising, in combination: first, second and third amplifier means each including input means and output means; input impedance means connecting an input signal to the input means of said first amplifier means; a first resistance feedback element connecting the output means of said first amplifier means to the input means of said first amplifier means; first capacitive means connecting the output means of said first amplifier means to the input means of said second amplifier means; first resistive means connecting the input means of said second amplifier means to a point of reference potential; second resistive means connecting the output means of said second amplifier means to the input means of said third amplifier means; second capacitive means connecting the input means of said third amplifier means to a point of reference potential; a second resistance feedback element connecting the output means of said third amplifier means to the input means of said first amplifier means; and wherein the product of the gain of said second and third amplifier means and the ratio of said first resistance feedback element to said second resistance feedback element is substantially equal to $1-(1/4Q^2)$ for a normalized center frequency at unity.

4. The combination of claim 3 wherein the product of said first resistive means and said first capacitive means is a time constant substantially equal to $2Q$ and the product of said second resistive means and said second capacitive means is a time constant having a magnitude substantially equal to $1/2Q$.

5. A bandpass Q-invariant active filter comprising, in combination: first, second and third amplifier means each including input means and output means; an input impedance connecting an input signal to the input means of said first amplifier means; a first resistance feedback element connecting the output means of said first amplifier means to the input means of said first amplifier means; first resistive means connecting the output means of said first amplifier means to the input means of said second amplifier means; first capacitive means connecting the input means of said second amplifier means to a point of reference potential; second capacitive means connecting the output means of said second amplifier means to the input means of said third amplifier means; second resistive means connecting the input means of said third amplifier means to a point of reference potential; a second resistance feedback element connecting the output means of said third amplifier means to the input means of said first amplifier means; and wherein the product of the gain of said second and third amplifier means and the ratio of the first resistance feedback element to the second resistance feedback element is substantially equal to $1-(1/4Q)$ for a normalized center frequency of unity.

6. The combination of claim 5 wherein the product of the first resistive means and the first capacitive means provides a time delay substantially equal to $1/2Q$ and the product of the second capacitive means and the second resistive means provides a time delay substantially equal to $2Q$.

7. A high pass Q-invariant active filter comprising, in combination: first, second and third amplifier means each including input means and output means; an input impedance connecting an input signal to the input means of said first amplifier means; a first resistance feedback element connecting the output means of said first amplifier means to the input means of said first amplifier means; first and second capacitive means connecting the output means of said first amplifier means to the input means of said second amplifier means and the output means of said second amplifier means to the input means of said third amplifier means, respectively; first and second resistive means connecting the input means of said second amplifier means and the input means of said third amplifier means to a point of reference potential, respectively a second resistance feedback element connecting the output means of said third amplifier means to the input means of said first amplifier means; and wherein the product of the gain of said second and third amplifier means and the ratio of said first resistance feedback element to said second resistance feedback element is substantially equal to $(4Q^2-\alpha 1)$.

8. The combination of claim 7 wherein a first time delay and a second time delay are determined by the product of said first resistive means and said first capacitive means and said second resistive means and said second capacitive means, respectively, with both products preselected to be substantially equal to $1/2Q$ when the pole center frequency is normalized at unity.

* * * * *